United States Patent
McHugh et al.

(10) Patent No.: US 6,570,763 B1
(45) Date of Patent: May 27, 2003

(54) HEAT SINK SECURING MEANS

(75) Inventors: Robert G. McHugh, Golden, CO (US); Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/074,539

(22) Filed: Feb. 12, 2002

(51) Int. Cl.⁷ .................................. H05K 7/20
(52) U.S. Cl. ............... 361/704; 361/707; 361/709; 361/719; 257/718; 257/727; 257/722; 174/16.3; 165/80.3; 165/185
(58) Field of Search ............... 361/704, 707, 361/709, 710, 715, 719; 257/718, 719, 727; 165/80.2, 80.3, 185; 174/16.3

(56) References Cited

U.S. PATENT DOCUMENTS

| | | | | |
|---|---|---|---|---|
| 4,679,118 A | * | 7/1987 | Johnson et al. | 361/386 |
| 5,302,853 A | * | 4/1994 | Volz et al. | 257/707 |
| 5,396,402 A | * | 3/1995 | Parugini et al. | 361/704 |
| 5,761,036 A | * | 6/1998 | Hopfar et al. | 361/704 |
| 6,222,731 B1 | * | 4/2001 | Katsui | 361/697 |

* cited by examiner

Primary Examiner—Boris Chervinsky
(74) Attorney, Agent, or Firm—Wei Te Chung

(57) ABSTRACT

A securing means is adapted to attach a heat sink (70) to a CPU on a circuit board (80). The securing means comprises a retention module (10) and a cover clip (30). The retention module has two front and two rear columns (14', 14) cooperatively defining a space therebetween for accommodating the heat sink. The cover clip has a pair of pivots (36) rotatably engaged with the rear columns, and locking means adapted to engage with the front columns. The cover clip is adapted to resiliently abut a top of the heat sink.

20 Claims, 8 Drawing Sheets

HEAT SINK SECURING MEANS

BACKGROUND OF THE INVENTION

1. Field of the Invention

The present invention relates to means for securing a heat sink onto a heat-generating electronic device mounted on a circuit board, and particularly to securing means which includes a retention module and a cover clip.

2. Description of Prior Art

In a computer, a heat sink is often used to remove heat generated by certain electronic devices such as central processing units (CPUs). A clip is frequently used to attach the heat sink to the electronic device.

Referring to FIGS. 7 and 8, a conventional clip 1 has a central pressing body 2 and a pair of resilient arms 3 depending from opposite ends of the pressing body 2. Each arm 3 defines an engaging hole 5 and an operation hole 6. In assembly, the clip 1 is placed on a heat sink 9. Initially, the engaging hole 5 of one arm 3 engagingly receives one ear 7 of a socket 8. A tool (not shown) is inserted into the operation hole 6 of the other arm 3 to urge the engaging hole 5 of the other arm 3 to engagingly receive an opposite ear 7 of the socket 8. The clip 1 is thereby securing to the socket 8. However, the clip 1 must be forcefully driven by the tool. The tool is prone to slip and damage components on and around the electronic device. This is particularly disruptive and costly on a mass production assembly line. Moreover, attachment and removal of the heat sink 9 to and from the socket 8 using the clip 1 must be performed with the tool. All these procedures are unduly cumbersome and laborious.

Therefore, a new heat sink securing means that overcomes the above-mentioned problems is desired.

SUMMARY OF THE INVENTION

Accordingly, an object of the present invention is to provide integrated heat sink securing means having compact configuration.

Another object of the present invention is to provide heat sink securing means which easily and safely attach a heat sink to an electronic device.

In order to achieve the objects set out above, a securing means in accordance with the present invention comprises a retention module and a cover clip. The retention module has two front and two rear columns cooperatively defining a space therebetween for accommodating a heat sink. The cover clip has a pair of pivots rotatably engaged with the rear columns, and locking means adapted to engage with the front columns. The cover clip is adapted to resiliently abut a top of the heat sink.

Other objects, advantages and novel features of the present invention will be drawn from the following detailed description of preferred embodiments of the present invention with attached drawings, in which:

DETAILED DESCRIPTION OF THE INVENTION

Figure 1:
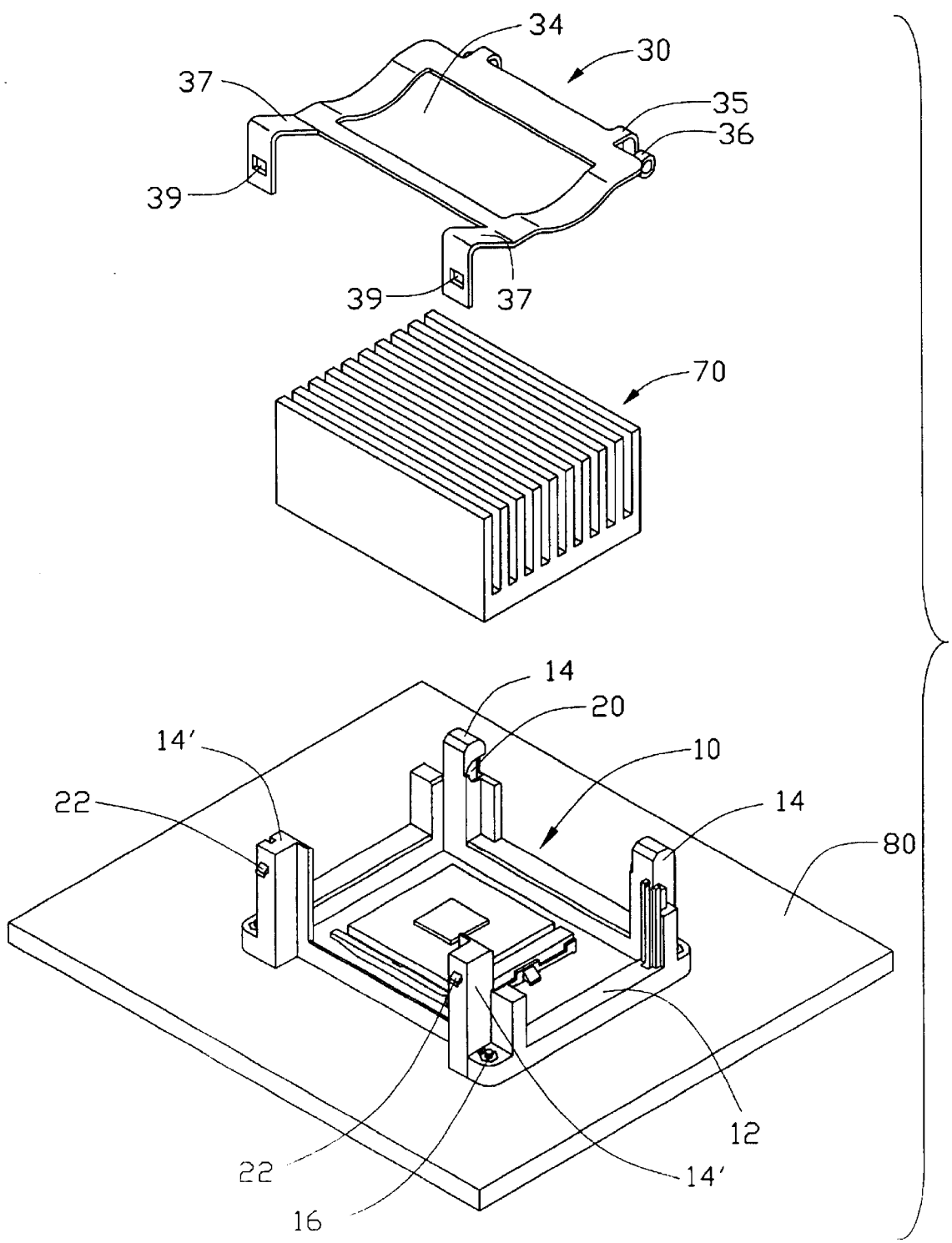
FIG. 1 is an exploded perspective view of a heat sink securing means in accordance with a preferred embodiment of the present invention, together with a heat sink, a CPU, a CPU socket and a circuit board.

FIG. 1 is an exploded view of a heat sink securing means in accordance with a preferred embodiment of the present invention. The securing means includes a retention module 10 and a cover clip 30. A heat sink 70 is attached to a CPU (not labeled) on a CPU socket (not labeled) by the securing means. The CPU socket is mounted on a circuit board 80 and located within the retention module 10.

The retention module 10 has a rectangular base frame 12 which surrounds the CPU and the CPU socket. The base frame 12 is secured to the circuit board 80 by a screw 16 at each of four corners of the base frame 12. A pair of front columns 14' and a pair of rear columns 14 respectively extend upwardly from the four corners of the base frame 12. The columns 14, 14' are accurately spaced to fittingly and securely accommodate the heat sink 70 therebetween. A pair of ears 22 is respectively formed on upper front portions of the front columns 14'. A pair of recesses 20 is respectively defined in upper portions of the rear columns 14. The recesses 20 oppose each other across a width of the base frame 12.

The cover clip 30 is made from a single piece of rectangular sheet metal having a generally wavelike profile, and is slightly resilient. A rectangular opening 34 is defined in a center of the cover clip 30. A pair of spaced tabs 35 depends from a rear edge of the cover clip 30. An end portion of each tab 35 is rolled to form a generally cylindrical pivot 36, for engaging in the recess 20 of a corresponding rear column 14 of the retention module 10. A pair of spaced resilient arms 37 extends outwardly and slightly upwardly and then downwardly from a front edge of the cover clip 30. A locking hole 39 is defined in a bottom portion of each resilient arm 37, for engagingly receiving a corresponding ear 22 of the retention module 10.

Figure 2:
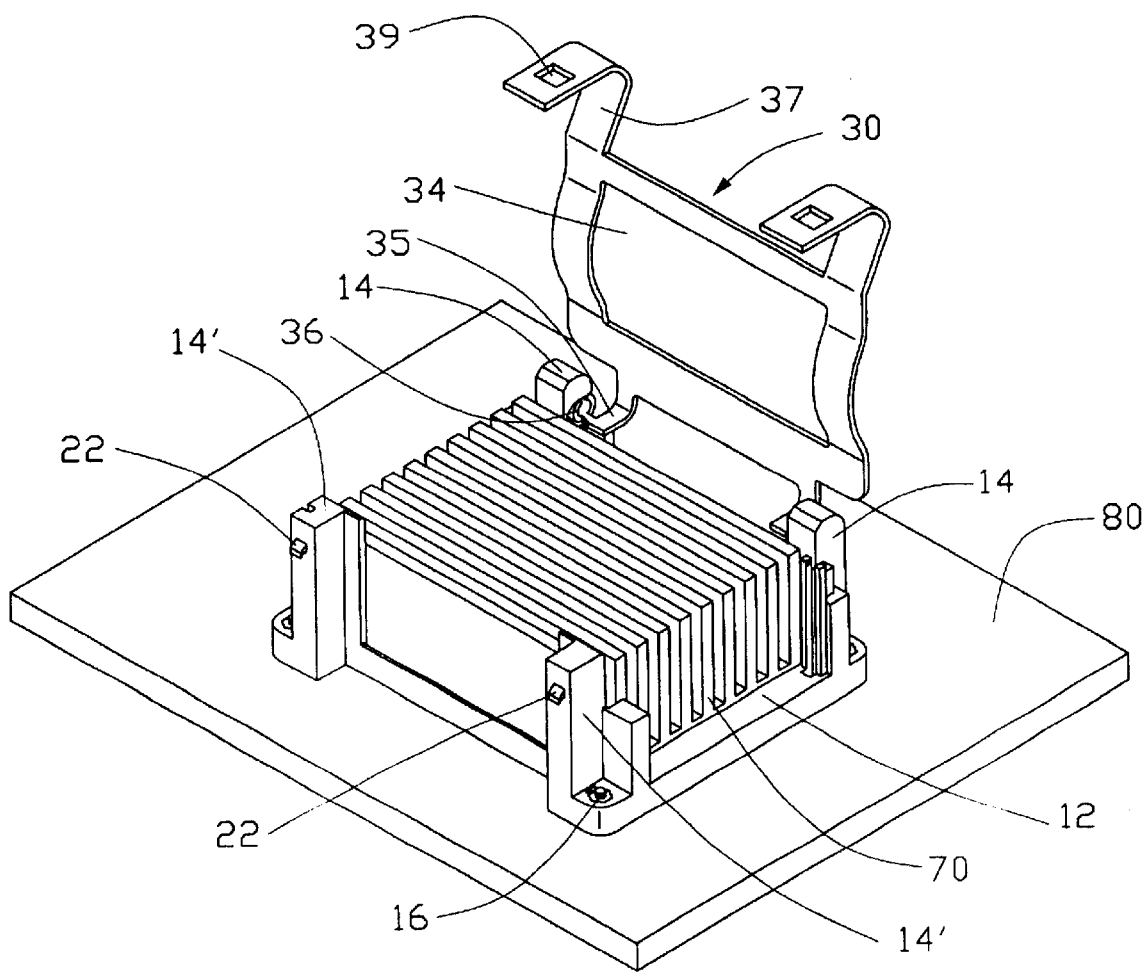
FIG. 2 is a partly assembled view of FIG. 1.
Figure 3:
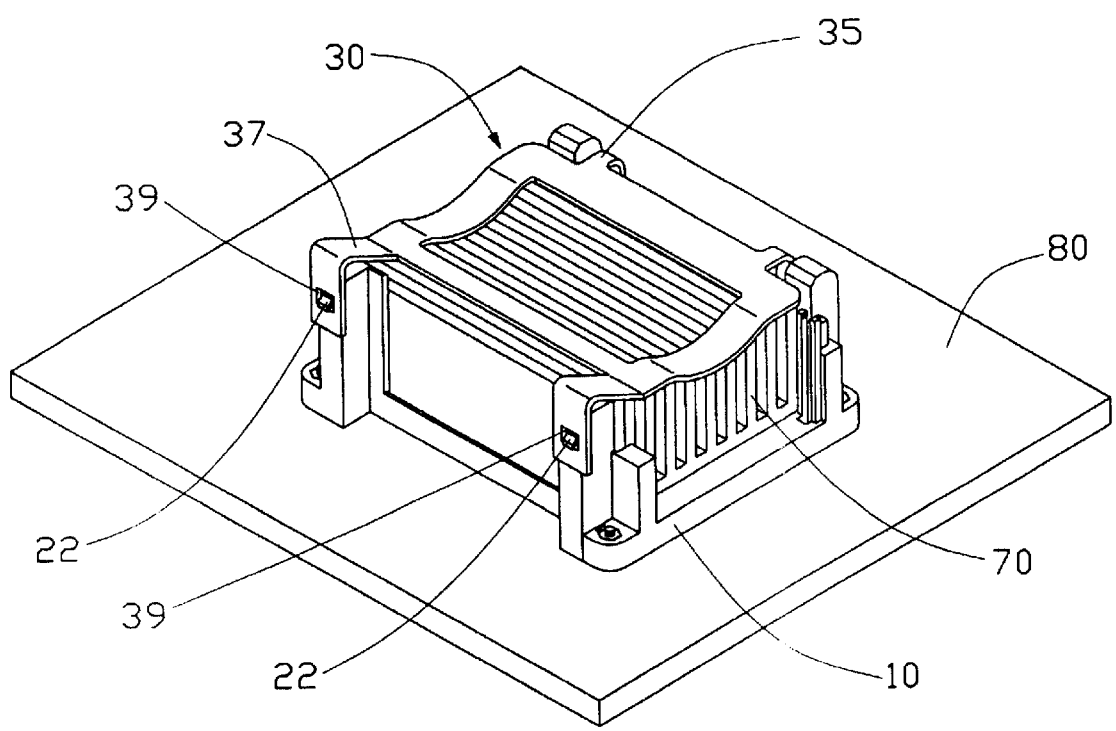
FIG. 3 is fully assembled view of FIG. 1.

Referring to FIGS. 1 to 3, in assembly, the cover clip 30 is firstly attached to the retention module 10. The pivots 36 of the cover clip 30 are engaged in the recesses 20 of the retention module 10. The heat sink 70 is placed between the columns 14, 14' of the retention module 10, and rests on the CPU. The cover clip 30 is pivoted to rest on a top of the heat sink 70. The resilient arms 37 are pushed down, urging the locking holes 39 to engagingly receive the ears 22 of the front columns 14'. The heat sink 70 is thus securely attached to the CPU.

Figure 4:
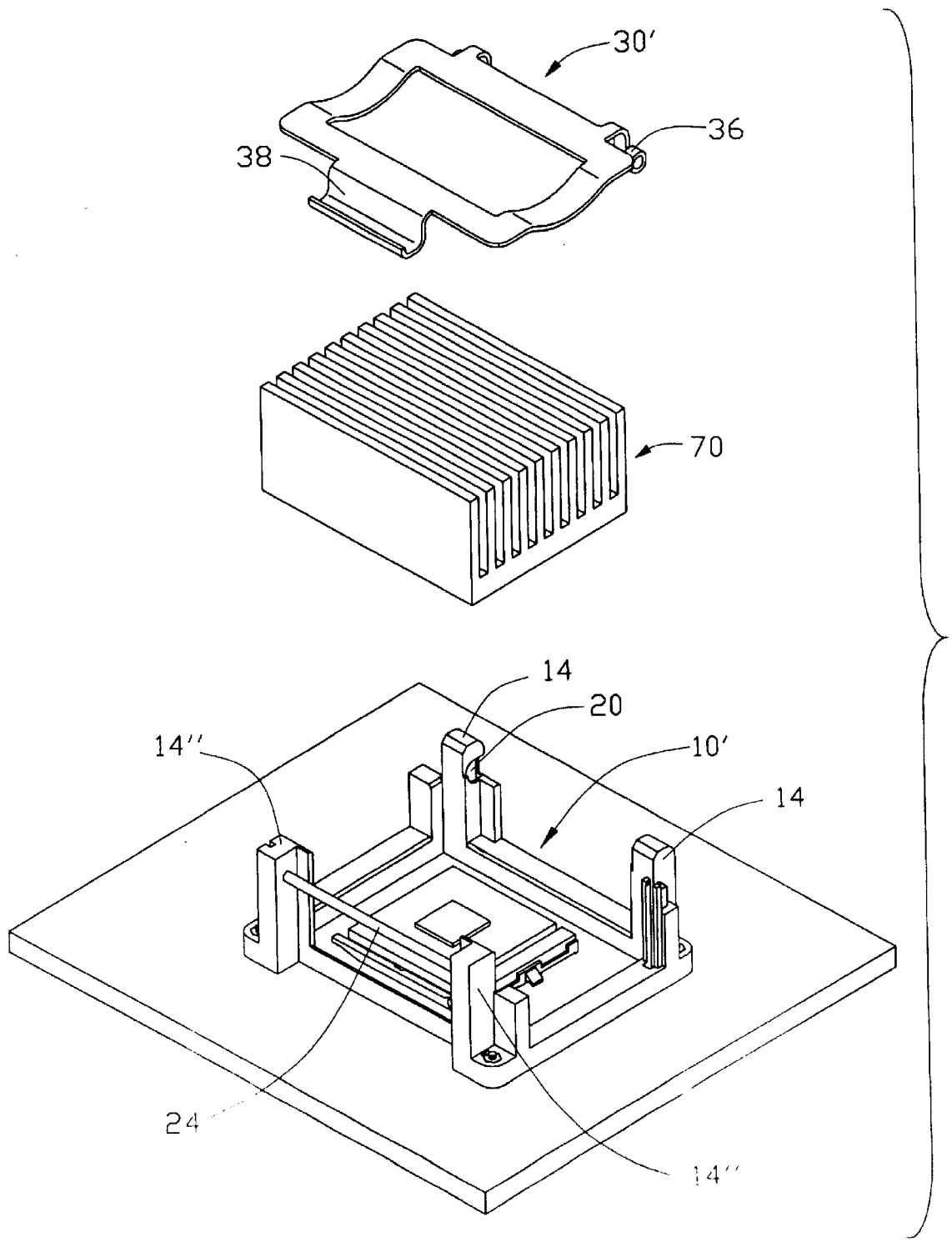
FIG. 4 is an exploded perspective view of a heat sink securing means in accordance with an alternative embodiment of the present invention, together with a heat sink, a CPU, a CPU socket and a circuit board.
Figure 5:
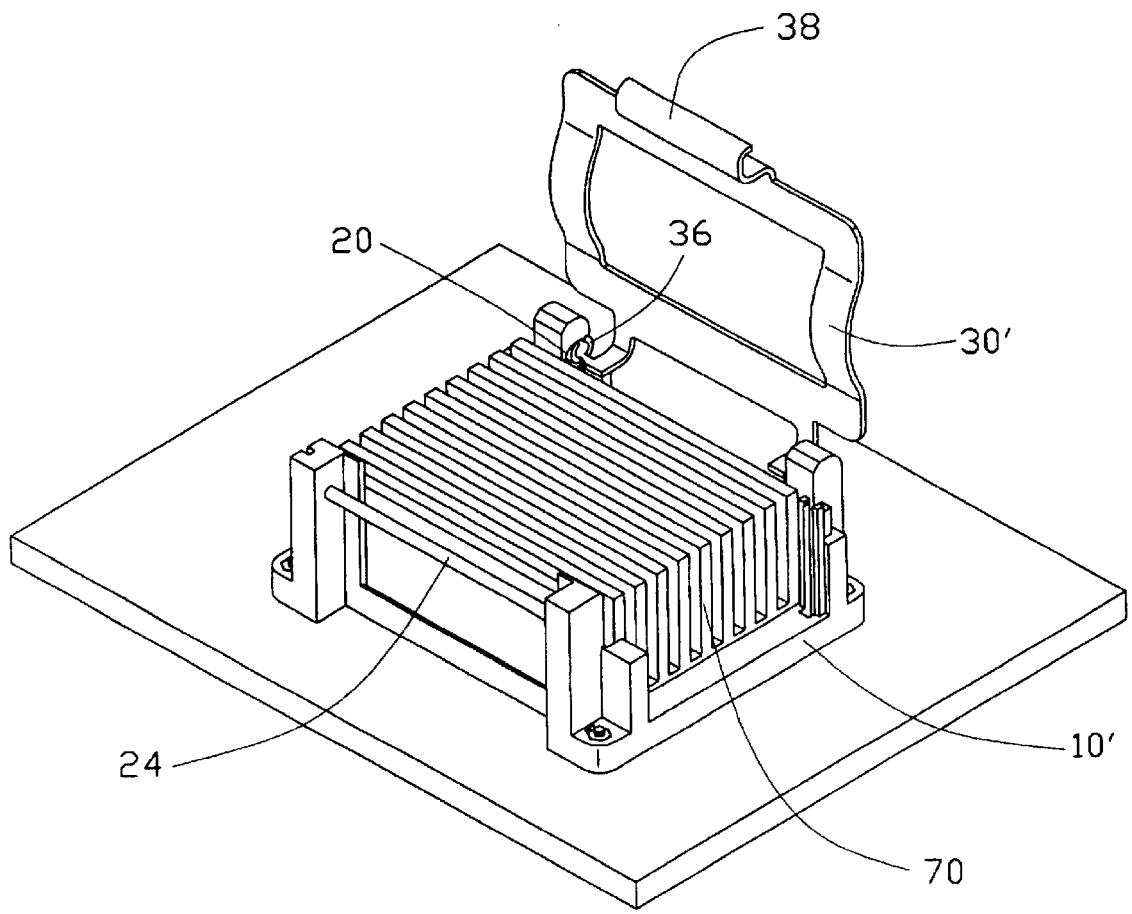
FIG. 5 is a partly assembled view of FIG. 4.
Figure 6:
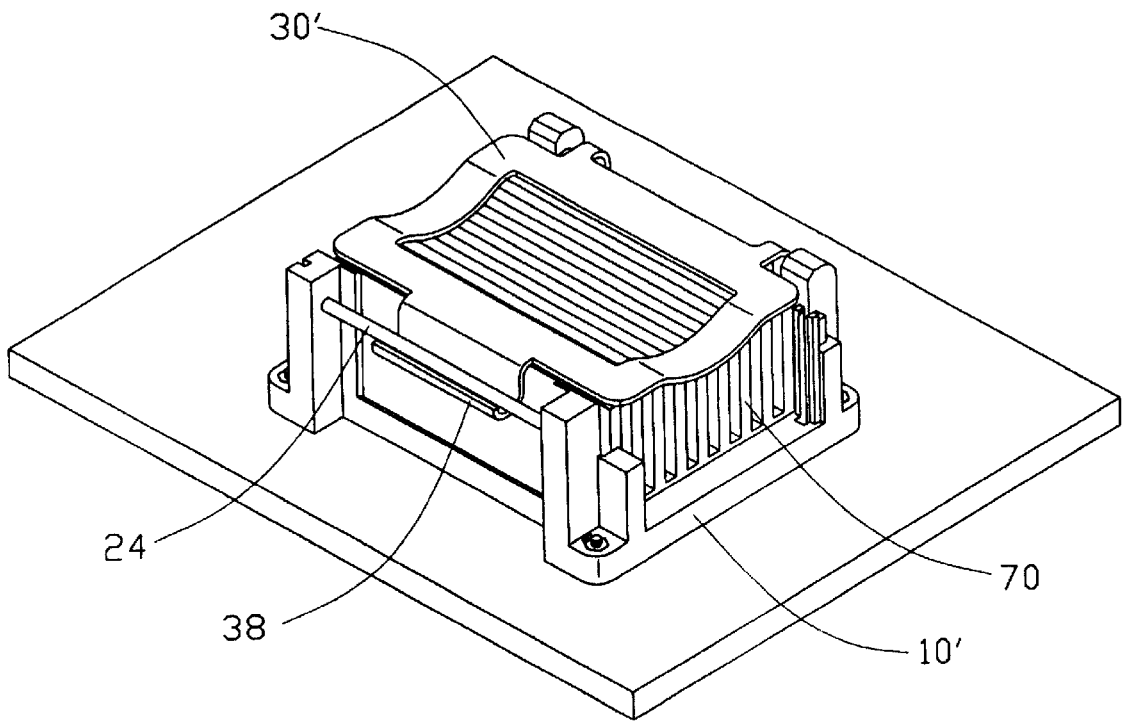
FIG. 6 is a fully assembled view of FIG. 4.
Figure 7:
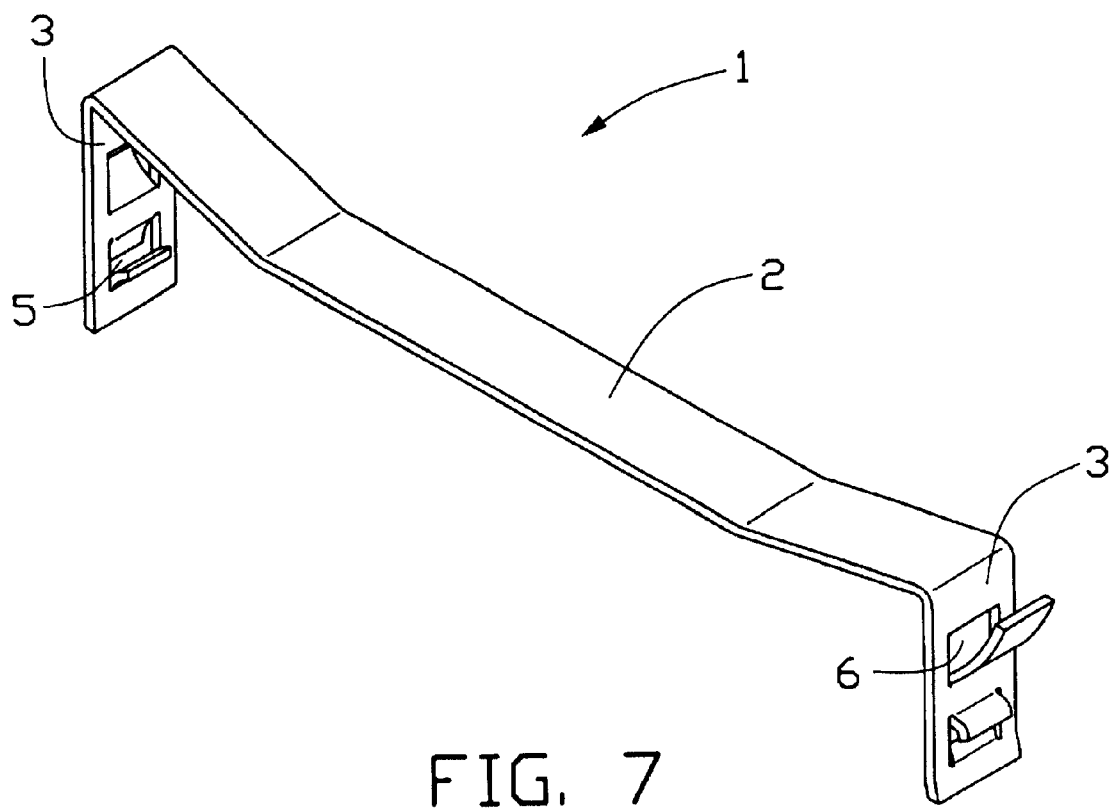
FIG. 7 is a perspective view of a conventional heat sink clip.
Figure 8:
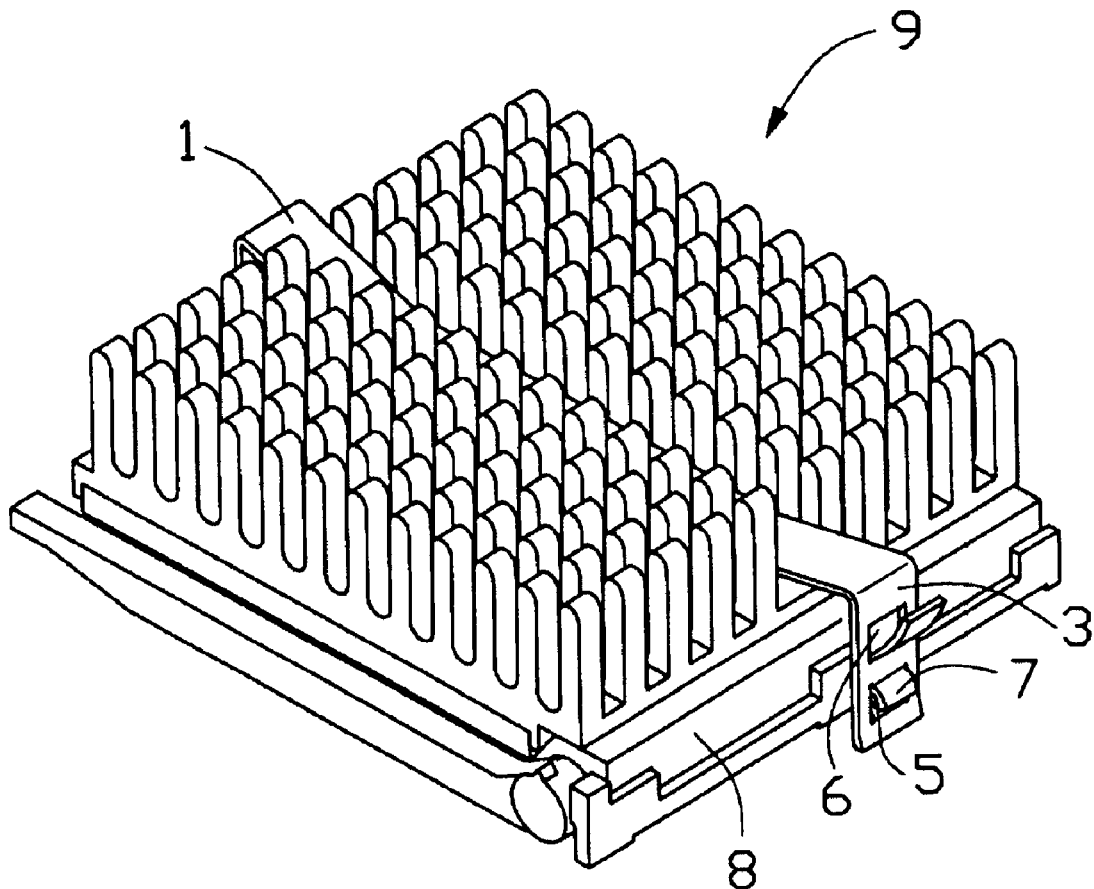
FIG. 8 is a perspective view of the clip of FIG. 7 attached to a CPU socket to thereby secure a heat sink to a CPU mounted on the CPU socket.

FIGS. 4 to 6 show a heat sink securing means in accordance with an alternative embodiment of the present invention. The securing means includes a retention module 10' and a cover clip 30'. The retention module 10' of the alternative embodiment has a beam 24 bridging upper portions of the front columns 14" of the retention module 10'. The cover clip 30' of the alternative embodiment has a generally U-shaped latch 38 depending from a front edge thereof.

In assembly, the cylindrical pivots 36 of the cover clip 30' are rotatably engaging in the recesses 20 of the rear columns 14 of the retention module 10'. The heat sink 70 is placed between the columns 14, 14" of the retention module 10', and rests on a CPU on a CPU socket. The cover clip 30' is pivoted to rest on the heat sink 70. The latch 38 is pushed down. A frontmost face of the latch 38 resiliently rides over a rear of the beam 24, and the latch 38 then resiliently hooks around the beam 24. The latch 38 resiliently presses upwardly against an underside of the beam 24. The heat sink 70 is thus securely attached to the CPU.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A securing means adapted to attach a heat sink to an electronic device on a circuit board, the securing means comprising:
   a retention module adapted to be mounted on the circuit board, the retention module comprising front and rear columns cooperatively defining a space therebetween adapted for accommodating the heat sink, each of the rear columns defining a recess therein; and
   a cover clip comprising at least one pivot rotatably engaging in the recesses of the rear columns, and locking means for engaging with the front columns, the cover clip being adapted to resiliently abut a top of the heat sink.

2. The securing means as described in claim 1, wherein the retention module has a base frame, the front and rear columns extend upwardly from the base frame, and the base frame is adapted to surround the electronic device and support the heat sink.

3. The securing means as described in claim 2, wherein the retention module comprises a pair of front columns and a pair of rear columns respectively extending upwardly from corners of the base frame.

4. The securing means as described in claim 3, wherein the recesses are defined opposite each other across a width of the base frame.

5. The securing means as described in claim 1, wherein the at least one pivot comprises at least one tab depending from the cover clip and forming a rolled portion at an end thereof.

6. The securing means as described in claim 1, wherein the cover clip is made from a single piece of wavelike sheet metal, and is resilient.

7. The securing means as described in claim 1, wherein an opening is defined in a middle of the cover clip.

8. The securing means as described in claim 1, wherein the locking means comprises a pair of resilient arms extending from the cover clip, and a pair of ears formed on the front columns of the retention module for engaging with the resilient arms.

9. The securing means as described in claim 8, wherein each of the resilient arms has a locking hole defined therein.

10. The securing means as described in claim 1, wherein the locking means comprises a latch extending from the cover clip, and the retention module further has a beam bridging the front columns for engaging with the latch.

11. An electronic device assembly, comprising:
    a central processing unit mounted on a circuit board;
    a heat sink; and
    a securing means attaching the heat sink to the central processing unit, the securing means comprising:
       a retention module comprising a base frame, and a pair of rear columns and a pair of front columns extending from four corners of the base frame respectively, each of the rear columns defines a recess therein; and
       a cover clip comprising at least one pivot engaging in the recesses of the rear columns, and locking means engaging with the front columns.

12. The electronic device assembly as described in claim 11, wherein the locking means comprises a pair of resilient arms extending from the cover clip, and a pair of ears formed on the front columns of the retention module engaging with the resilient arms.

13. The securing means as described in claim 12, wherein each of the resilient arms defines a locking hole therein.

14. The electronic device assembly as described in claim 11, wherein the locking means comprises a latch extending from the cover clip, and the retention module further has a beam bridging the front columns and engaging with the latch.

15. The electronic device assembly as described in claim 11, wherein the at least one pivot of the cover clip comprises at least one tab depending from the cover clip and forming a rolled portion at an end thereof.

16. The securing means as described in claim 11, wherein the recesses are defined opposite each other across a width of the base frame.

17. An electrical device assembly comprising:
    a printed circuit board;
    a CPU and an associated socket fixedly mounted upon the printed circuit board;
    a heat sink seated upon the CPU;
    a retention module securely mounted on the printed circuit board defining an inner space receiving said socket and said CPU therein, said inner space defining lengthwise and lateral dimensions perpendicular to each other, said retention module defining front and rear pairs of column portions upwardly extending beyond the socket with a significant distance; and
    a cover clip pivotally mounted on said column portions with means at thereof a distal free end to fasten to a portion of the retention module under a condition that the cover clip presses the heat sink against the CPU thereunder; wherein the front pair and the rear pair of the column portions are located within a range of the lateral dimension of said inner space, and the heat sink is dimensioned to be close to said inner space.

18. The assembly as described in claim 17, wherein said column portions substantially fully restrain the heat sink from horizontal movement.

19. The assembly as described in claim 17, wherein a height of the column portions is similar to a height of the heat sink.

20. The assembly as described in claim 17, wherein said cover clip does not fully restrain lateral movement of the heat sink.

* * * * *